United States Patent
Kim et al.

(10) Patent No.: US 7,368,219 B2
(45) Date of Patent: **\*May 6, 2008**

(54) POLYMER FOR FORMING ANTI-REFLECTIVE COATING LAYER

(75) Inventors: Sang-Jung Kim, Kyungki-do (KR); Jong-Yong Kim, Kyungki-do (KR); Deog-Bae Kim, Kyungki-do (KR); Jae-Hyun Kim, Kyungki-do (KR)

(73) Assignee: Dongjin Semichem Co., Ltd. (KR)

( \* ) Notice: Subject to any disclaimer, the term of this patent is extended or adjusted under 35 U.S.C. 154(b) by 167 days.

This patent is subject to a terminal disclaimer.

(21) Appl. No.: 11/312,788

(22) Filed: Dec. 20, 2005

(65) Prior Publication Data

US 2006/0134558 A1    Jun. 22, 2006

(30) Foreign Application Priority Data

Dec. 20, 2004  (KR)  ............ 10-2004-0108766

(51) Int. Cl.
 *G03C 1/76* (2006.01)
(52) U.S. Cl. ............ 430/270.1; 430/311; 430/273.1; 430/325; 430/330; 430/331; 526/266; 526/329
(58) Field of Classification Search ............ 430/270.1, 430/313, 316; 428/432
See application file for complete search history.

(56) References Cited

U.S. PATENT DOCUMENTS 6,110,595 A * 8/2000 Suzuki et al. .......... 430/270.11

2006/0134558 A1 * 6/2006 Kim et al. ............ 430/311

\* cited by examiner

*Primary Examiner*—Cynthia H. Kelly
*Assistant Examiner*—Ponder N Thompson-Rummel
(74) *Attorney, Agent, or Firm*—Tuchman & Park LLC

(57) ABSTRACT

A polymer for forming an organic anti-reflective coating layer between an etching layer and a photoresist layer to absorb an exposure light in a photolithography process and a composition comprising the same are disclosed. The polymer for forming an organic anti-reflective coating layer has a repeating unit represented by

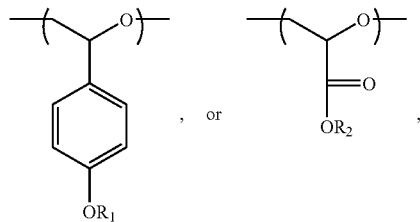

wherein, $R_1$ is hydrogen or methyl group, and $R_2$ is a substituted or non-substituted alky group of C1 to C5. The composition for forming the organic anti-reflective coating layer includes the polymer having the repeating unit represented by above Formulas; a light absorber; and a solvent.

10 Claims, 1 Drawing Sheet

POLYMER FOR FORMING ANTI-REFLECTIVE COATING LAYER

CROSS-REFERENCE TO RELATED APPLICATIONS

This application claims priority of Korean Patent Application No. 10-2004-0108766 filed on Dec. 20, 2004.

FIELD OF THE INVENTION

This invention relates to a polymer for forming an anti-reflective coating layer, and more specifically to a polymer and a composition comprising the same for forming an organic anti-reflective coating layer between an etching layer and a photoresist layer to absorb an exposure light in a photolithography process.

BACKGROUND OF THE INVENTION

In general, a photolithography process comprises the steps of applying a photoresist composition on a substrate such as wafer, glass, ceramic, metal, and so on by a spin coating or a roller coating, forming a photoresist layer by heating and drying the applied photoresist composition, forming a photoresist pattern by exposing the photoresist layer to a exposure light of a predetermined pattern, optionally heating, and developing the exposed photoresist layer, and forming a semi-conductor element pattern by etching the substrate with the formed photoresist pattern as a mark. The photolithography process is widely used in production of a semi-conductor such as IC (Integrated Circuit), a LCD (Liquid Crystal Display), and so on.

Due to the increasing demand for the highly integrated semi-conductor device, ArF excimer laser using an exposure light of wavelength of 193 nm, which is shorter than the wavelength (248 nm) of the KrF excimer laser, is used as the light source to increase the resolution of a photoresist pattern. In addition, $F_2$ (157 nm) excimer laser, EUV (Extreme Ultra Violet), VUV (Vacuum Ultra Violet), E-beam, X-beam, ion beam, etc have been studied and developed as a light source of a lithography process. However, as being shorter the wavelength of the exposure light, optical interference of the light reflected from the etching layer of the semi-conductor substrate during the exposure process increases. In addition, due to undercutting, notching, etc., the photoresist pattern profile and the uniformity of thickness are deteriorated. To overcome these problems, the anti-reflective coating layer is conventionally formed between the etching layer and the photoresist layer to absorb the exposure light. The anti-reflective coating layer can be classified into the inorganic anti-reflective coating layer made of titanium, titanium dioxide, titanium nitride, chrome oxide, carbon, amorphous silicon, and so on, and the organic anti-reflective coating layer made of a polymer, which depends on the material for forming the anti-reflected coating layer. In comparison with the inorganic layer, the organic anti-reflective coating layer does not generally require complex and expensive apparatus such as a vacuum deposition equipment, a chemical vapor deposition (CVD) device, a sputter device and so on for forming the layer, and has a high absorptivity of a radioactive light, and is generally insoluble in a photoresist solvent. Also, small materials thereof does not diffuse from the anti-reflective coating layer into a photoresist layer during coating, heating, and drying the photoresist layer, and the organic anti-reflective coating layer has an excellent etch rate in a dry etch process of a photolithography process. But until now, the conventional composition for forming the organic anti-reflective coating layer is not satisfactory in its characteristics, such as the absorptivity of an exposure light, an etch rate, an adhesion property to a substrate, and so on.

SUMMARY OF THE INVENTION

Therefore, it is an object of the present invention to provide a polymer, which easily forms an organic anti-reflective coating layer having an improved adhesion property to a substrate and a fast etch rate.

It is other object of the present invention to provide a composition for forming an organic anti-reflective coating layer, which has a high absorptivity of a light reflected from an etching layer, a low loss of thickness due to a photoresist solvent, an excellent etch rate in a dry etch process, a good contraction stability and a good coating uniformity.

It is another object of the present invention to provide a method for forming a semi-conductor element pattern by using the composition for forming an organic anti-reflective coating layer.

To accomplish these objects, the present invention provides a polymer for forming an organic anti-reflective coating layer, which comprises a repeating unit represented by the following Formula 1 or 2.

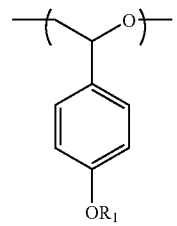

[Formula 1]

In Formula 1, $R_1$ is hydrogen or methyl group,

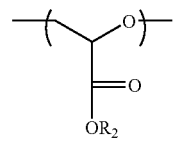

[Formula 2]

In Formula 2, $R_2$ is a substituted or non-substituted alky group of C1 to C5, and preferably, 2-hydroxyl ethyl group, 2-hydroxyl propyl group or glycidyl group. The substituent of $R_2$ can be hydroxyl group or epoxy group.

The present invention also provides a composition comprising the polymer, a light absorber and a solvent. The present invention further provides a method for forming a semi-conductor element pattern, which comprises the steps of: applying the composition for forming an organic anti-reflective coating layer on an etching layer; forming the organic anti-reflective coating layer by curing the composition applied on the etching layer; forming a photoresist pattern by applying a photoresist composition on the organic anti-reflective coating layer to form a photoresist layer, exposing the photoresist layer to an exposure light of a predetermined pattern, and developing the exposed photoresist layer; and forming an etching pattern by etching the organic anti-reflective coating layer and the etching layer.

DETAILED DESCRIPTION OF THE INVENTION

Figure 1:
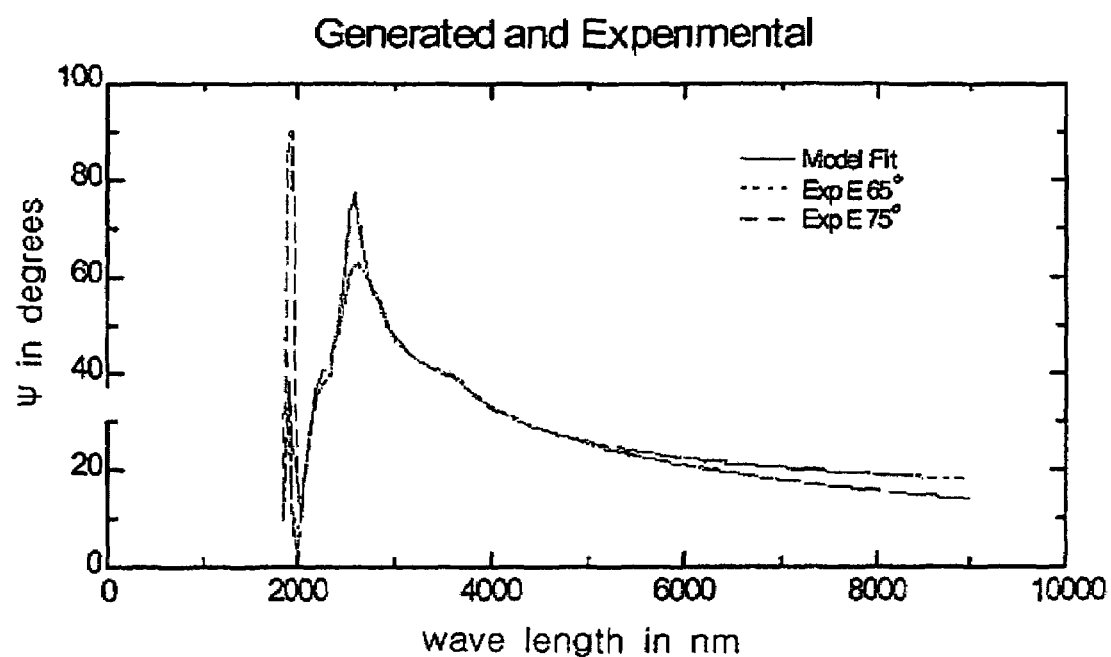
FIG. 1 is a graph showing the ellipsometric angle of the polymer prepared in Example 1 of the present invention with respect to a wavelength of light.

A more complete appreciation of the invention, and many of the attendant advantages thereof, will be better appreciated by reference to the following detailed description.

The polymer for forming an anti-reflective coating layer according to the present invention comprises a repeating unit represented by the Formula 1 or 2. The preferable polymer for forming the organic anti-reflective coating layer includes a polymer represented by the following Formula 3 or 4.

[Formula 3]

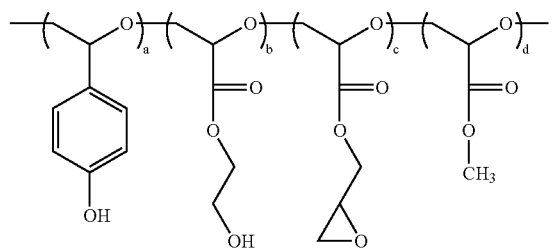

polymer, and the ratio of a: b: c: d is 0.1-90%: 0.1-90%: 0.1-90%: 0.1-90% and is preferably 5-80%: 5-80%: 5-80%: 5-80%.

The polymer works as a base resin in the organic anti-reflective coating layer, and have ethyleneoxide group in its main chain. Thus, the etch rate of the organic anti-reflective coating layer is improved. In addition, due to the hydroxyl group or epoxide group in its side chain, cross-linking reaction is induced when heated, and the organic anti-reflective coating layer is easily formed. In case of having alkyl-oxycarbonyl group in its side chain, the adhesion property to a substrates is improved. The weight-average molecular weight of the polymer is preferably 5,000 to 50,000. If the molecular weight is less than 5,000, the organic anti-reflective coating layer can be dissolved by a photoresist solvent. If the molecular weight is more than 50,000, a solubility of the polymer to a solvent might decrease, and the etch rate of the organic anti-reflective coating layer in a dry etch process might decrease. The amount of the polymer in its composition may be varied according to the molecular weight of the polymer, the desired thickness of the organic anti-reflective coating layer, and so on, and is preferably 0.1 to 30 weight % with respect to the total amount of the composition for forming the organic anti-reflective coating layer. If the amount is less than 0.1 weight %, the adhesion property of the organic anti-reflective coating layer might decrease. If the amount is more than 30 weight %, the solubility of polymer to its solvent might decrease.

The polymer of the present invention can be prepared by the following procedure. For example, monomers represented by the following Formula 5 or 6 are dissolved with a solvent such as dichloromethane, and after adding polymerization catalyst such as borontrifluoride diethylether to the solution, the polymerization reaction is carried out at room temperature. After completion of the reaction, the product is precipitated with water, and the precipitate is filtered and dried.

[Formula 4]

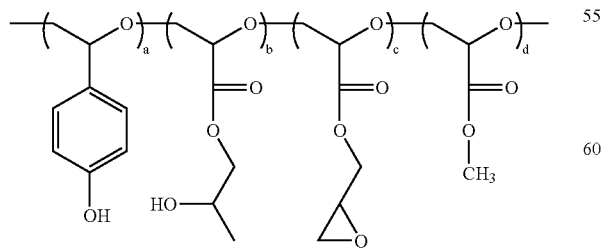

[Formula 5]

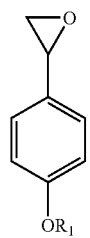

In Formula 3 and 4, a, b, c, and d is a mole fraction of a repeating unit with respect to the total repeating unit of the In Formula 5, $R_1$ is hydrogen, methyl group, or methyl carbonyl group,

[Formula 6]

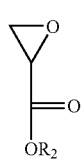

In Formula 6, $R_2$ is a substituted or non-substituted alky group of C1 to C5 (i.e., the number of carbons is 1 to 5.), and preferably, 2-hydroxyl ethyl group, 2-hydroxyl propyl group or glycidyl group. The substituent of $R_2$ can be hydroxyl group or epoxy group.

In the present invention, the composition for forming the organic anti-reflective coating layer comprises the polymer comprising the repeating unit represented by the Formula 1 or 2, a light absorber, and a solvent. The light absorber is to absorb a light reflected from an etching layer in a photolithography process, and thereby to prevent the problems such as a undercutting, a notching which may occur in a photoresist pattern. As the light absorber useful in the present invention, various conventional light absorbers can be used. The representative example of the light absorber can be represented by the following Formula 7, which is disclosed in Korean Patent Application No. 2004-76011, the content of which is included in this specification for reference.

[Formula 7]

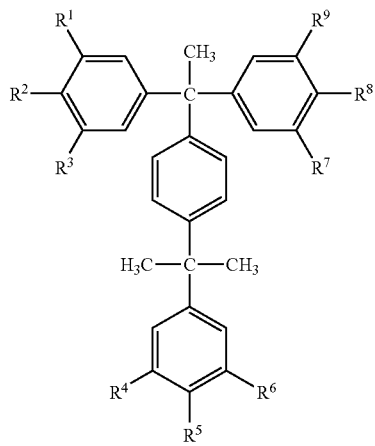

In Formula 7, $R_1$ to $R_9$ are independently hydrogen, hydroxyl group, halogen, nitro group, amino group, alkyl group of C1 to C8 with or without hydroxyl group, alkoxy group of C1 to C8 with or without carbonyl group, phenyl group, cycloalkyl group of C5 to C10, aryl-alkyl group of C5 to C10, alkyl-aryl group of C5 to C10, and at least one of $R_1$ to $R_9$ is not hydrogen. The preferable light absorber includes

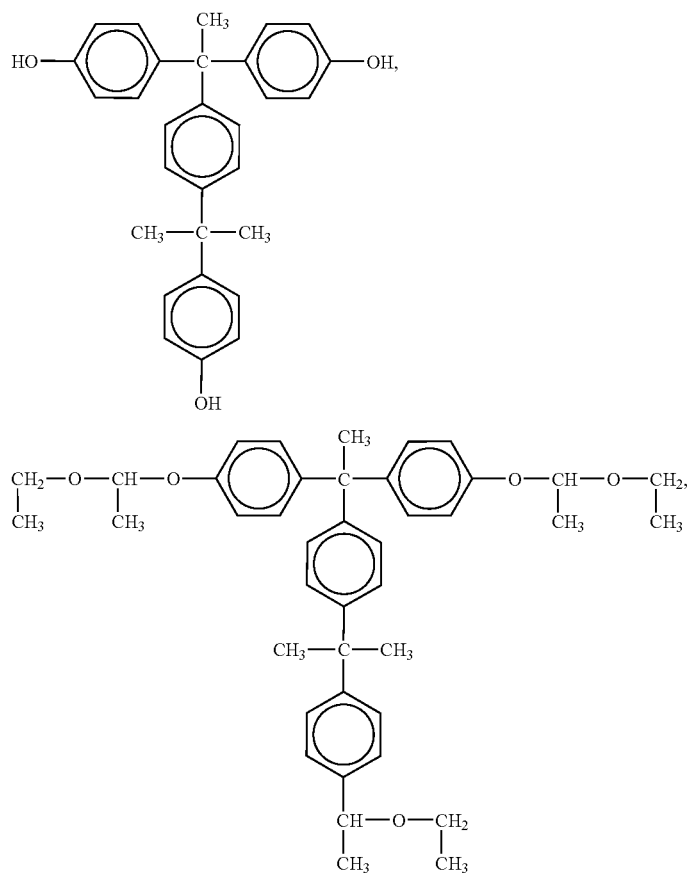

-continued
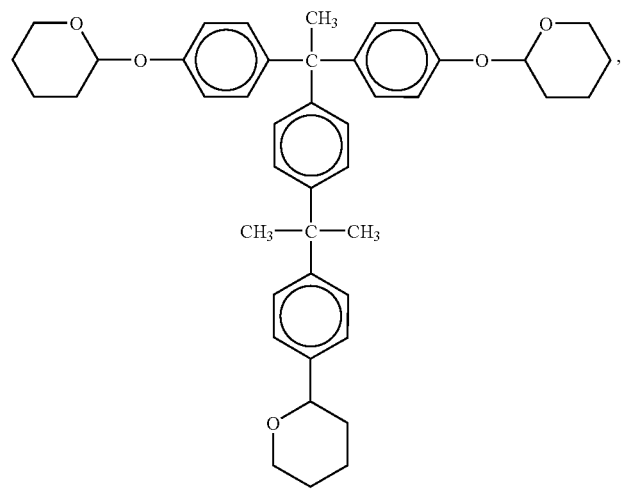
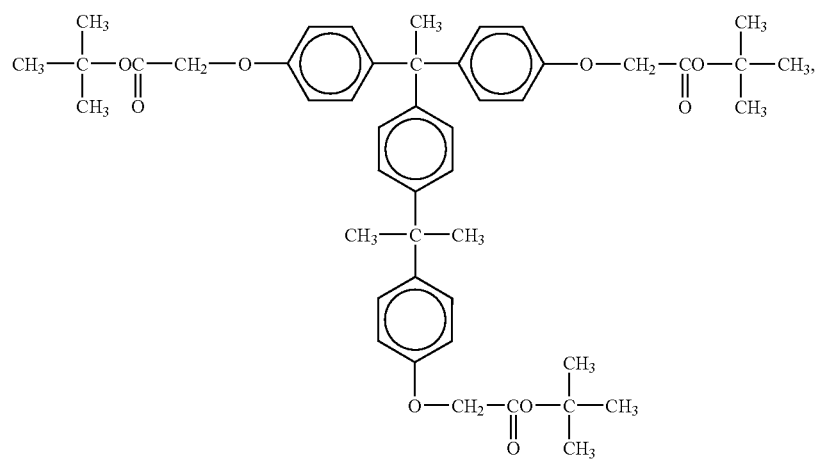
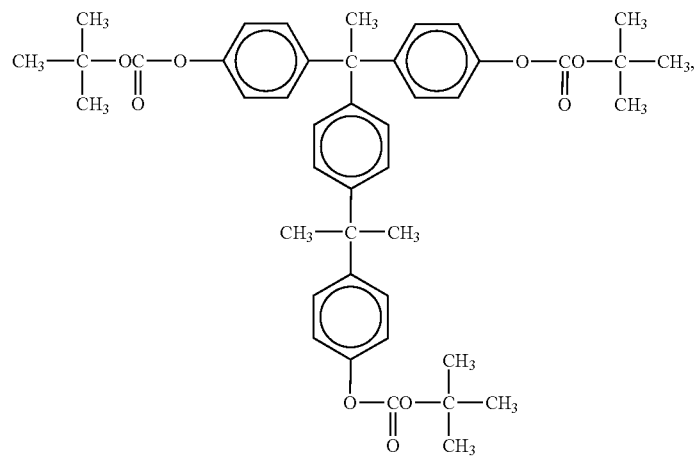

-continued
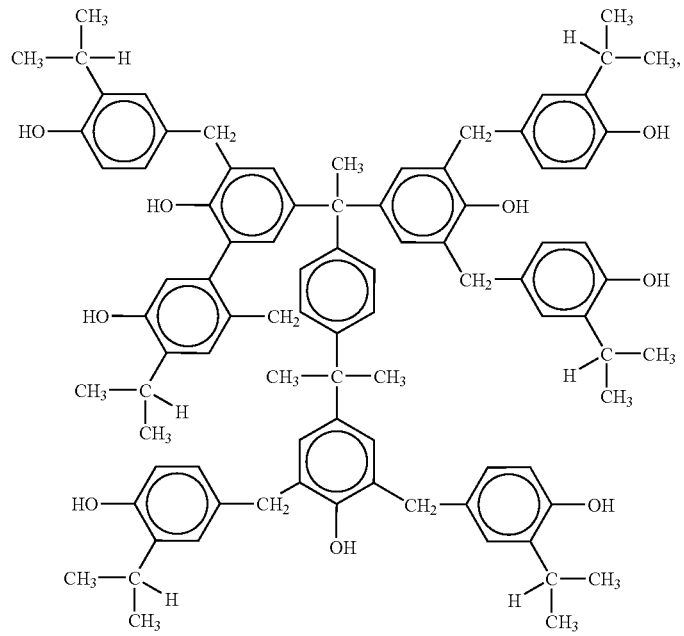
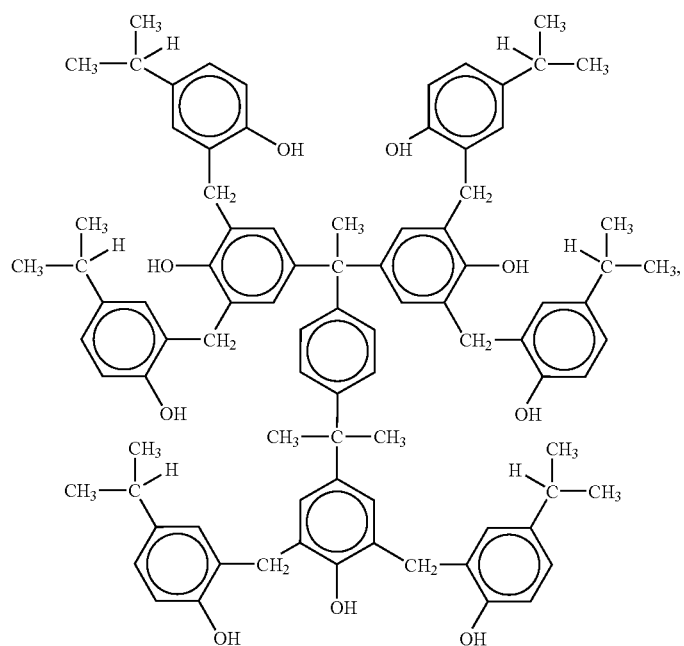

-continued
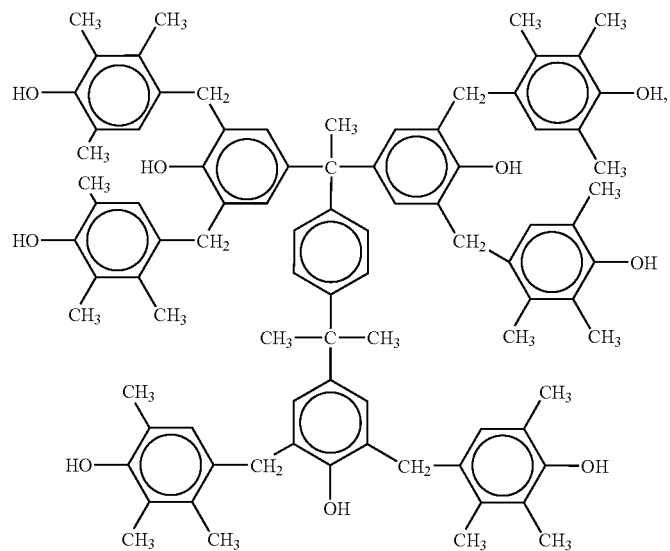
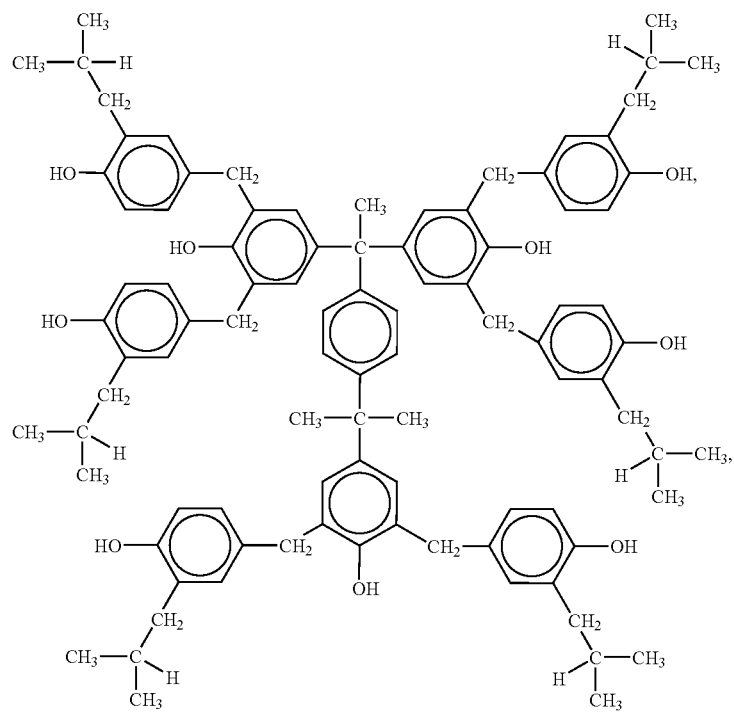

-continued
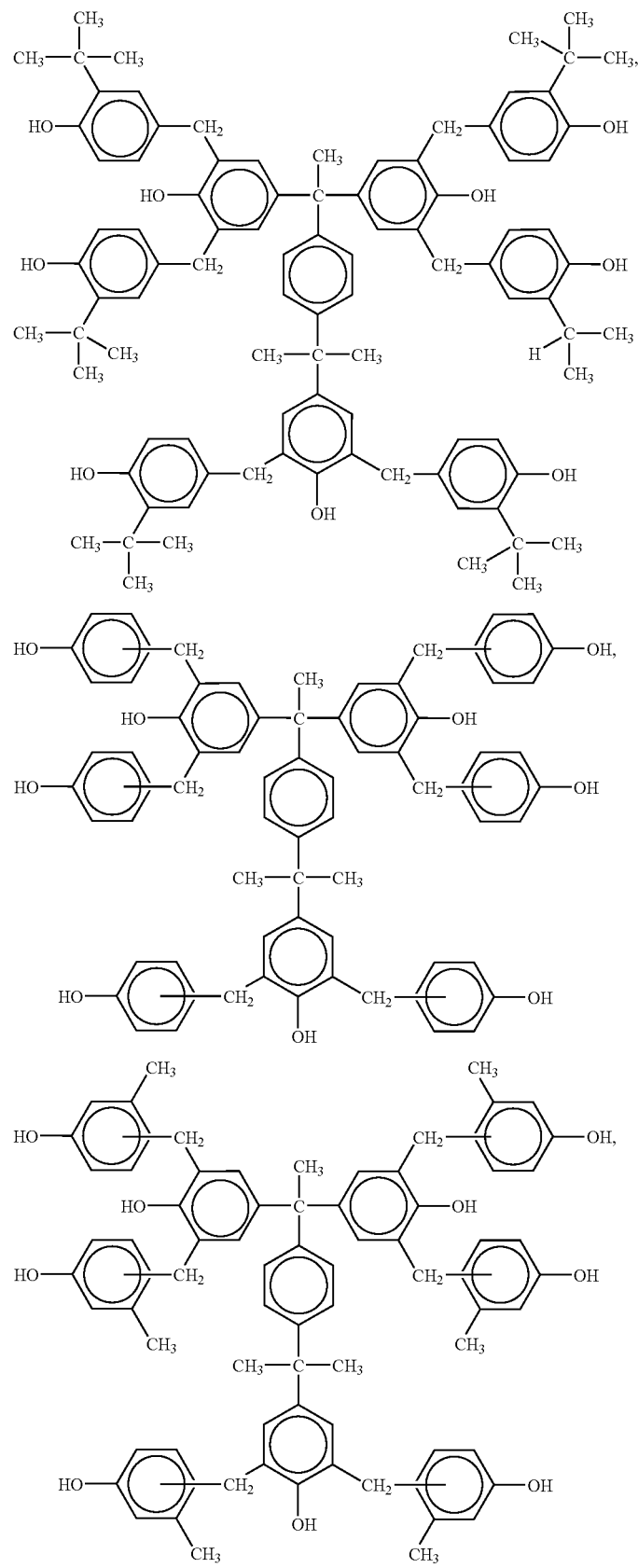

-continued
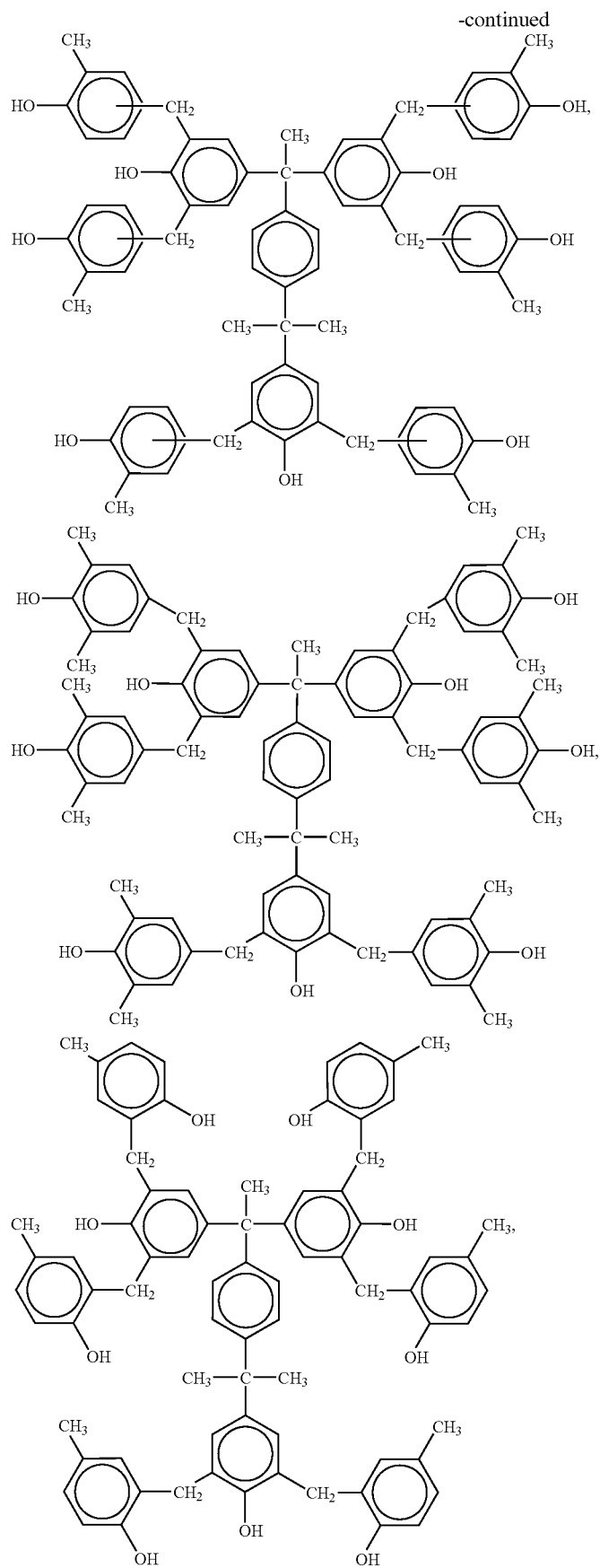

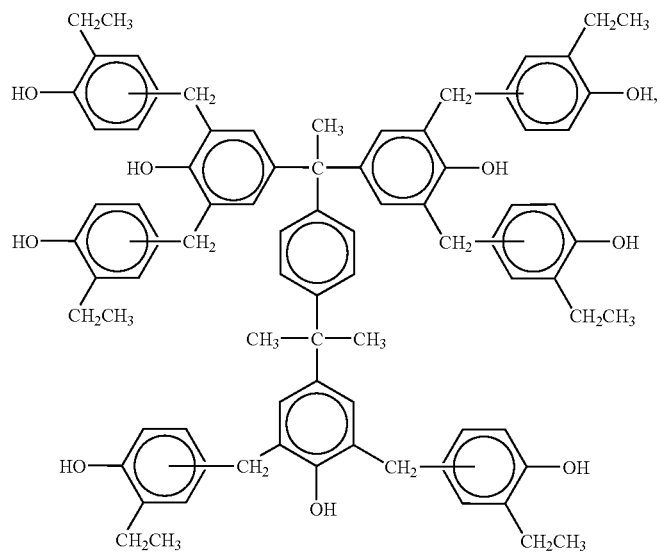
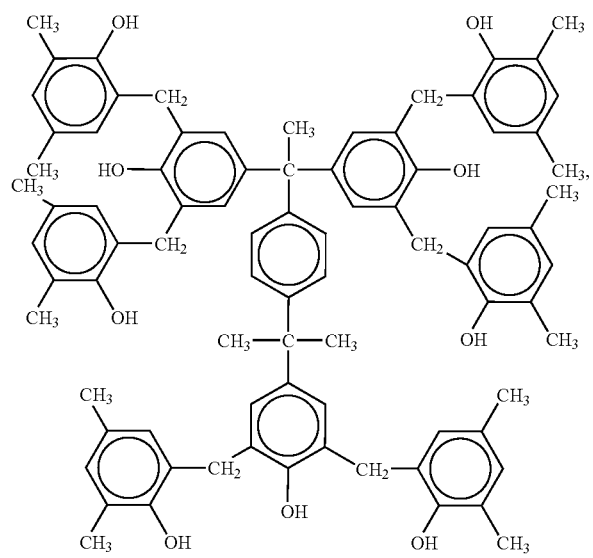
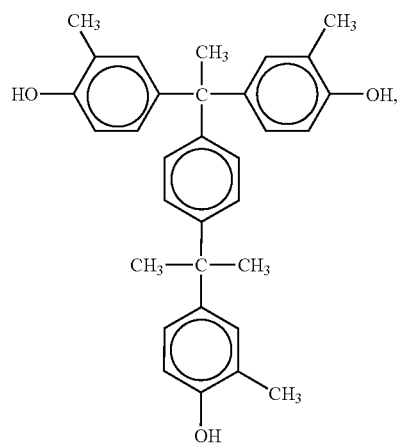
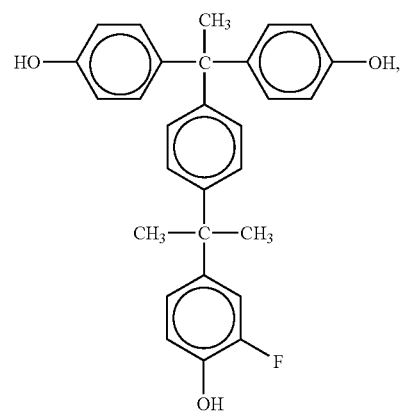

-continued

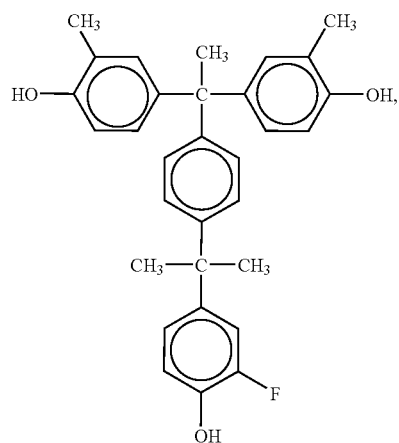
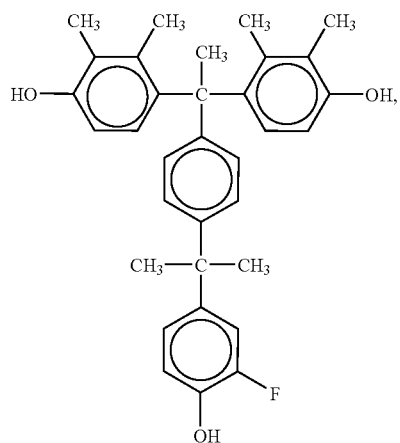
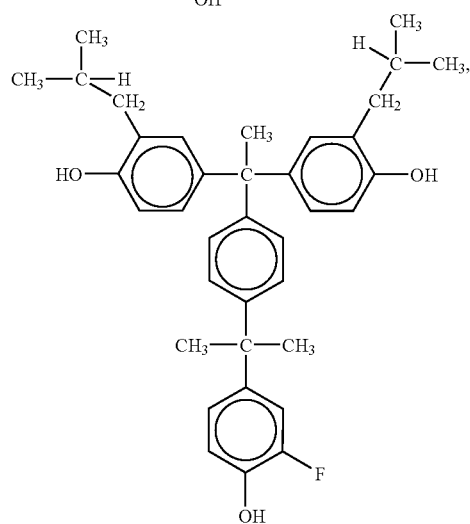
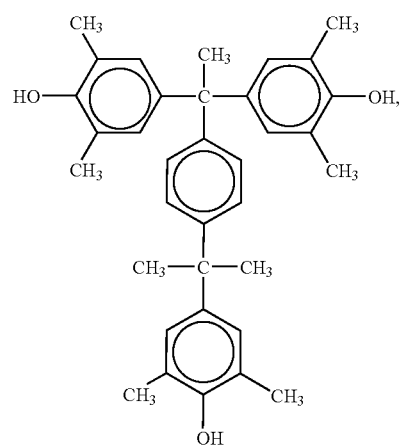
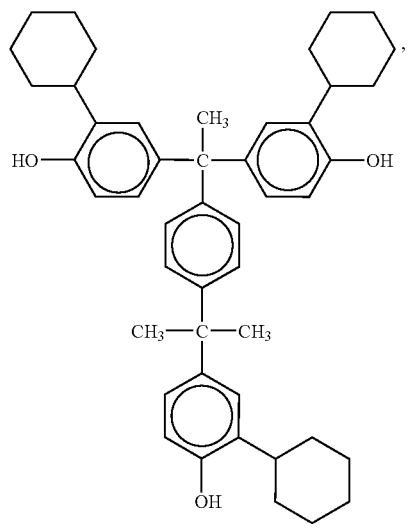

and the mixtures thereof.

The light absorber represented by Formula 7 has the excellent absorptivity for a variety of exposure light reflected from the etching layer of a substrate, including the exposure light from ArF excimer laser. Accordingly, the undercutting and notching occurring due to the exposure light can be prevented, and the pattern profile having uniform thickness can be obtained in a photolithography process. Also, due to the bulky structure of the light absorber, the organic anti-reflective coating layer does not contracted excessively. The light absorber also works as a plasticizer, which assists the composition's uniform coating even on a curved substrate. In addition, the light absorber has a good compatibility with a high molecular weight material such as a polymer, and has an excellent solubility to a solvent for forming the organic anti-reflective coating layer, and has a good reactivity with a cross-linking agent, and accordingly, a loss of thickness which may occur by a photoresist solvent can be prevented. In particular, the light absorber has an excellent absorptivity for an exposure light from ArF excimer laser, and thereby the light absorber can be effectively used for a semi-conductor substrate having a high reflectivity. The amount of the light absorber is preferably 0.1 to 30 weight % with respect to the total amount of the composition for forming the organic anti-reflective coating layer. If the amount is less than 0.1 weight %, an undercutting and notching in a photoresist pattern can occur due to the low absorptivity of light reflected from the substrate of a semi-conductor. If the amount is more than 30 weight %, the coating apparatus can be spoiled due to the occurrence of fumes in a heating process.

As the solvent, which is a component of the composition for forming the organic anti-reflective coating layer according to the prevent invention, a compound which can dissolve the solid components of the composition can be widely used. The preferable solvent has a low toxicity and is capable of forming the uniform organic anti-reflective coating layer. The preferable solvent for the present invention includes butyrolactone, cyclopentanon, cyclohexanon, dimethyl acetamide, dimethyl formamide, dimethyl sulfoxide, N-methyl pyrrolidone, tetrahydro furfural alcohol, propyleneglycol monomethylether(PGME), propyleneglycol monomethylether acetate(PGMEA), ethylactate and the mixtures thereof, and the more preferable solvent includes propyleneglycol monomethylether, propyleneglycol monomethylether acetate(PGMEA), ethylactate and the mixtures thereof. The amount of the solvent is preferably 40 to 99.8 weight % with respect to the total amount of the composition for forming the organic anti-reflective coating layer. If the amount is less than 40 weight %, the thickness of the organic anti-reflective coating layer may become non-uniform. If the amount is more than 99.8 weight %, the physical characteristic of the formed organic anti-reflective coating layer such as the absorbance of an exposure light may be deteriorated.

The composition for forming the organic anti-reflective coating layer according to the present invention, can further include the second organic polymer which improves the coating characteristic of the composition, and can be cured by heating to increase the adhesion property of the organic anti-reflective coating layer. The non-limiting examples of such organic polymer include polymer or co-polymer of acrylate, methacrylate, styrene, hydroxy styrene, oxyalkylene, oxymethylene, amide, imide, ester, ether, vinylacetate, vinylether methyl, vinylether-maleric anhydride, and urethance. Other non-limiting examples include phenolic resin, epoxy resin, novolac resin, and the mixtures thereof. The weight-average molecular weight of the second polymer is preferably 5,000 to 50,000. If the weight-average molecular weight is less than 5,000, the organic anti-reflective coating layer may be dissolved in a photoresist solvent. If the weight-average molecular weight is more than 50,000, the solubility of the polymer might be low, and an etch rate of the organic anti-reflective coating layer in a dry etch process can decrease.

Also, the composition for forming the organic anti-reflective coating layer according to the present invention may further include a cross-linking accelerator such as a cross-linking agent, a low molecular weight alcohol, an acid, or an acid generator, a leveling agent, an adhesion promoter, an anti-foaming agent, and other various additives. As the cross-linking agent, which is used for hardening the organic anti-reflective coating layer, a cross-linkable monomer can be preferably used. More preferable the cross-linking agent includes a cross-linking agent for cross-linking the polymer having hydroxyl group, amide group, carboxyl group, or thiol group. The non-limiting examples of the cross-linking agent includes hydroxylmethyl melamine, alkoxylmethyl melamine, urea-formaldehyde resin, benzyl ether, benzyl alcohol, epoxy compound, phenolic resin, isocyanate, alkylol acrylamide, metacrylamide and the mixtures thereof. As the cross-linking accelerator, which promotes the cross-linking reaction and increases the reaction efficiency, a thermal acid generator can be preferably used, and the example of the thermal acid generator is 2-hydroxyhexyl p-toluenesulfonate.

To form the organic anti-reflective coating layer with the composition of the present invention, the composition for forming the organic anti-reflective coating layer is applied on an etching layer, and the applied composition is cured by heating. The process of applying the composition for forming the organic anti-reflective coating layer on the etching layer is carried out by a conventional method such as spin coating, roller coating and so on. Also, the curing process is carried out by heating the applied composition in an apparatus such as a high-temperature plate, a convection oven, and so on. The curing process can be preferably carried out at high temperature, so that the cured organic anti-reflective coating layer may not be dissolved in an organic solvent of a photoresist composition or an aqueous alkaline developer. The preferable temperature of the curing process is 70□ to 250□. If the curing temperature is less than 70□, the solvent included the composition for forming the organic anti-reflective coating layer can be not removed sufficiently, and the cross-linking reaction can be not carried out sufficiently. If the curing temperature is more than 250□, the composition for forming the organic anti-reflective coating layer and the organic anti-reflective coating layer might become chemically unstable.

In the cured organic anti-reflective coating layer, the amount of the light absorber is preferably 1 to 50 weight %, and the amount of the organic polymer comprising the repeating unit represented by Formula 1 or 2 is preferably 50 to 99 weight %. If the amount of the light absorber is less than 1 weight %, the absorptivity of the exposure light is not satisfactory, and accordingly an undercutting may occur in a formed photoresist pattern. If the amount of the light absorber is more than 50 weight %, the adhesion property of the organic anti-reflective coating layer is low, and the organic anti-reflective coating layer may be dissolved by the solvent of a photoresist composition.

The method for forming a semi-conductor element pattern by using the composition for forming the organic anti-reflective coating layer according to the present invention comprises the steps of: applying the composition for forming the organic anti-reflective coating layer on an etching layer; forming the organic anti-reflective coating layer by curing, for example, by heat-curing the composition applied on the etching layer; forming a photoresist pattern by applying a photoresist composition on the organic anti-reflective coating layer to form a photoresist layer, exposing the photoresist layer to an exposure light of a predetermined pattern, and developing the exposed photoresist layer; and forming an etching pattern by etching the organic anti-reflective coating layer and the etching layer by using the formed photoresist pattern as a mask. Here, the process of forming the organic anti-reflective coating layer is described above. The photoresist pattern forming step is a conventional process and can be easily carried out by a skilled person in the art according to the photoresist composition. For example, the photoresist composition is applied or coated on the organic anti-reflective coating layer by a conventional method such as spin-coating, and the photoresist layer can be exposed to an exposure light through a photo-mask of a predetermined pattern. As the light source for radiating the exposure light, KrF(248 nm), ArF(193 nm), F2(157 nm) excimer laser, electron beam, EUV(Extreme Ultra Violet), VUV(Vacuum Ultra Violet), X-beam, ion beam, and so on can be used. The preferable light source is ArF excimer laser. The composition of the present invention can be used in an emulsion-lithography process. Also, the process of forming the photoresist pattern can optionally include the step of baking the photoresist layer before or after the light exposing process, and the preferable baking temperature is 70□ to 200□. If the baking temperature is less than 70□, the organic solvent in the photoresist composition may not be sufficiently evaporated. If the baking temperature is more than 200□, the photoresist composition might be pyrolyzed. The developing process can be carried out by using a conventional aqueous developer, and for example, by using the 0.01 to 5 weight % TMAH (tetramethyl ammonium hydroxide) solution. In the next step, the organic anti-reflective coating layer and the etching layer are etched by using the formed photoresist pattern as a mask to form the etching layer pattern. The etching process can be carried out by a conventional dry etching process. The semi-conductor element pattern is formed by etching the organic anti-reflective coating layer and the etching layer.

The polymer and the light absorber, which are components of the composition for forming the organic anti-reflective coating layer according to the present invention, can be purified with an ion-exchange column, a filter and/or an extracting process before use. By such purification process, the concentration of metal ions or other particles in the polymer and the light absorber can be lowered. Preferably, the concentration of metal ions can be lowered to 50 ppm with respect to the total amount of the composition. The organic anti-reflective coating layer is etched after developing the photoresist layer as described above. Thus, the decrease of the concentration of the metal ion prevents the quality degradation of the semi-conductor after the etching step.

Hereinafter, the preferable examples are provided for better understanding of the present invention. However, the present invention is not limited to the following examples.

MANUFACTURING EXAMPLE 1

Preparation of 4-acetoxy Styreneoxide 30 g of 4-acetoxy styrene and 1 L of chloroform were added into a 2 L reactor, and was stirred and cooled in iced water. 47 g of 3-chloroperoxybenzoicacid were added into the cooled solution, and the reaction was carried out at room temperature for 24 hours. After completion of the reaction, the 3-chlorobenzoicacid (by-product) was removed by filtering the product, and then the residual 3-chlorobenzoicacid was removed by washing 2 times with saturated sodium sulfite aqueous solution, 1 time with saturated sodium bicarbonate aqueous solution, 1 time with saturated sodium chloride aqueous solution, and 1 time with distilled water. Next, the product was dried with magnesium sulfate, and chloroform was removed under reduced pressure, and then the product was vacuum dried for 1 day to obtain 27.6 g of the pure 4-acetoxy styreneoxide.

MANUFACTURING EXAMPLE 2

Preparation of 2-hydroxyethyl-oxycarbonyl Ethyleneoxide

Except of using 30 g of 2-hydroxyethyl acrylate instead of 30 g of 4-acetoxy styrene, the reaction of Example 1 is carried out to obtain 25 g of 2-hydroxyethyl-oxycarbonyl ethyleneoxide.

MANUFACTURING EXAMPLE 3

Preparation of Glycidyl-oxycarbonyl Ethyleneoxide

Except of using 30 g of glycidyl acrylate instead of 30 g of 4-acetoxy styrene, the reaction of Example 1 is carried out to obtain 22 g of glycidyl-oxycarbonyl ethyleneoxide.

MANUFACTURING EXAMPLE 4

Preparation of methyl-oxycarbonyl Ethyleneoxide

Except of using 30 g of methyl acrylate instead of 30 g of 4-acetoxy styrene, the reaction of Example 1 is carried out to obtain 23 g of methyl-oxycarbonyl ethyleneoxide.

EXAMPLE 1

Preparation of Polymer

As shown in the following Reaction 1, 20 g of 4-acetoxy styrene oxide prepared by Manufacturing Example 1, 8 g of 2-hydroxyethyl-oxycarbonyl ethylene oxide prepared by Manufacturing Example 2, 8 g of glycidyl-oxycarbonyl ethylene oxide prepared by Manufacturing Example 3, and 6 g of methyl-oxycarbonyl ethylene oxide prepared by Manufacturing Example 4 were added into a 500 mL flask, and were dissolved with a 150 mL of dichloromethane, and then the solution was stirred and cooled in iced water. Next, 3 mL of borontrifluoride diethylether, which is a polymerization catalyst, was very slowly and dropwisely added to the solution with a syringe. After increasing temperature of the reaction product to room temperature, the reaction was carried out under nitrogen atmosphere for 4 days. After completion of the reaction, the reaction product was precipitated by being poured into 3 L water, and the pure solid reaction product was obtained. The obtained product was filtered and dried. Ammonia and methanol were added to the filtered and dried reaction product, and the reaction was carried out at 60□ for 12 hours. After completion of the reaction, the reaction product was precipitated by being poured into 3 L water, and filtered and dried to obtain 30 g of the polymer represented by the Formula 4. The mole ratio of repeating units in the polymer was measured by NMR, and a, b, c, and d were 25 mol %, 30 mol %, 30 mol %, and 15 mol %, respectively. The weight-average molecular weight, which was measured by GPC, was 8,200, and Glass transition temperature(Tg), which was measured by DSC, was 162□. The reflective index (n) of the polymer was 1.72, which was measured with an ellipsometer, and the extinction coefficient (k) of the polymer was 0.65. The graph showing the ellipsometric angle of the polymer prepared in Example 1 with respect to a wavelength of light is depicted in FIG. 1.

[Reaction Formula 1]

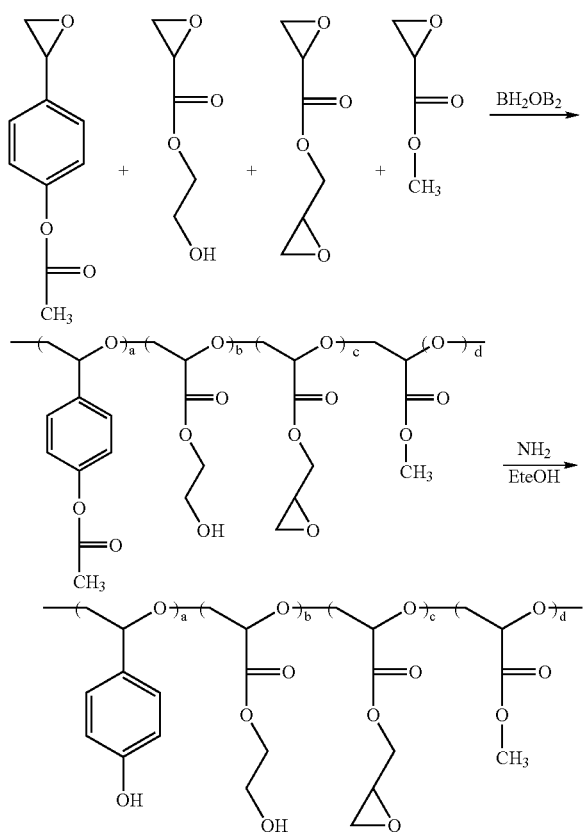

EXAMPLE 2

Preparation of a Composition for Forming an Organic Anti-reflective Coating Layer 0.13 g of the polymer prepared in Example 1, 0.091 g of a light absorber represented by the following Formula 8, 0.06 g of polyvinyl phenol as a cross-linking agent, 0.01 g of 2-hydroxyhexyl p-toluenesulfonate as an acid-generator, and 13.67 of propyleneglycol monomethylether acetate (PG-MEA) were mixed to obtain a composition for forming an organic anti-reflective coating layer.

[Formula 8]

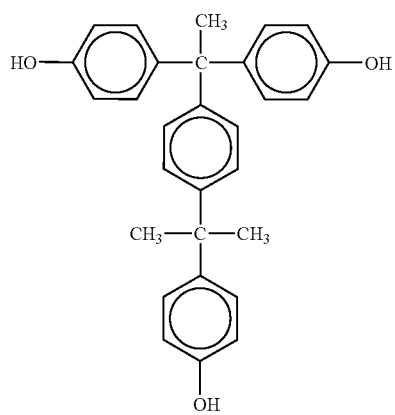

EXAMPLE 3

Forming an Organic Anti-reflective Coating Layer

The composition for forming an organic anti-reflective coating layer prepared in Example 2 was uniformly applied on a silicon substrate with a thickness of 350□, and was cured at 205□ for 90 seconds to form an organic anti-reflective coating layer. A mixture of 33.3 weight % of 2-heptanone, 33.3 weight % of ethylactate(EL), and 33.4 weight % of propyleneglycol monomethylether acetate, which are the conventional solvents for a photoresist composition, was sufficiently sprayed on the produced organic anti-reflective coating layer, then was settled for 1 minute, was dried for 30 seconds while spinning the substrate with the spinning speed of 5000 rpm, and was heated on a heating-plate at 100□ for 60 seconds. After the treatment of the solvent mixture, the loss of thickness of the organic anti-reflective coating layer was 0%.

The polymer for forming an organic anti-reflective coating layer according to the present invention easily forms the organic anti-reflective coating layer, and improves the etch rate and the adhesion property of the organic anti-reflective coating layer. The composition for forming an organic anti-reflective coating layer has a high absorptivity of an exposure light, for example, 192 nm exposure light from ArF excimer laser, which is reflected from an etching layer in the lithography process.

What is claimed is:

1. A polymer for forming an organic anti-reflective coating layer comprising a repeating unit represented by the following Formula 1 or 2,

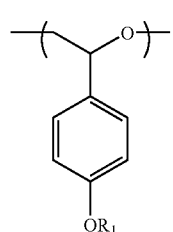

Formula 1 wherein, R$_1$ is hydrogen or methyl group,

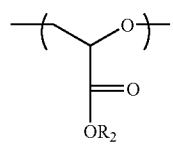

Formula 2 wherein, R$_2$ is a substituted or non-substituted alky group of C1 to C5.

2. The polymer of claim 1, wherein R$_2$ is selected from the group consisting of 2-hydroxyl ethyl group, 2-hydroxyl propyl group and glycidyl group.

3. The polymer of claim 1, wherein the polymer is represented by the following Formula 3 or 4, Formula 3

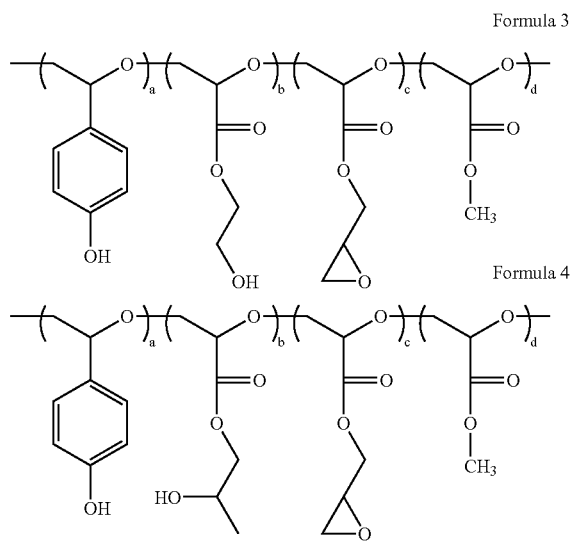

Formula 4 wherein, a, b, c, and d is a mole fraction of a repeating unit with respect to the total repeating unit of the polymer, and the ratio of a: b: c: d is 0.1-90%: 0.1-90%: 0.1-90%: 0.1-90%.

4. The polymer of claim 1, wherein the weight-average molecular weight of the polymer is 5,000 to 50,000.

5. A composition for forming an organic anti-reflective coating layer comprising: a polymer including a repeating unit represented by Formula 1 or Formula 2 of claim 1; a light absorber; and a solvent.

6. The composition for forming the organic anti-reflective coating layer of claim 5, wherein the light absorber is a compound represented by the following Formula 7, Formmual 7

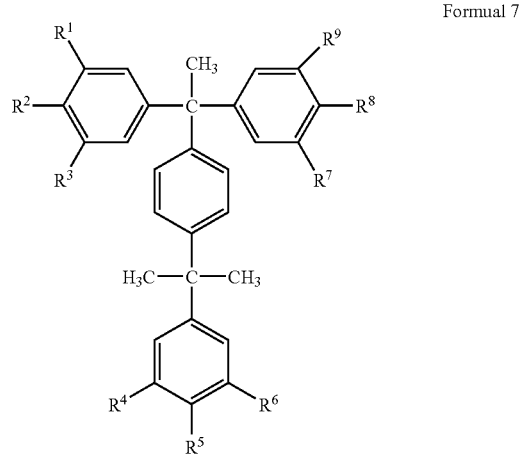

wherein, $R_1$ to $R_9$ are independently hydrogen, hydroxyl group, halogen, nitro group, amino group, alkyl group of C1 to C8, alkoxy group of C1 to C8, phenyl group, cycloalkyl group of C5 to C10, aryl-alkyl group of C5 to C10, alkyl-aryl group of C5 to C10, and at least one of R1 to R9 is not hydrogen.

7. The composition for forming the organic anti-reflective coating layer of claim 5, wherein the solvent is selected from the group consisting of butyrolactone, cyclopentanone, cyclohexanone, dimethyl acetamide, dimethyl formamide, dimethyl sulfoxide, N-methyl pyrrolidone, tetrahydrofurfural alcohol, propyleneglycol monomethylether, propyleneglycol monomethylether acetate, ethylactate and the mixtures thereof.

8. The composition for forming the organic anti-reflective coating layer of claim 5, wherein the amount of the polymer is 0.1 to 30 weight %, the amount of the light absorber is 0.1 to 30 weight %, and the amount of the solvent is 40 to 99.8 weight %.

9. The composition for forming the organic anti-reflective coating layer of claim 5, further comprising an organic polymer selected from the group consisting of polymer or co-polymer of acrylate, methacrylate, styrene, hydroxy styrene, oxyalkylene, oxymethylene, amide, imide, ester, ether, vinylacetate, vinylether methyl, vinylether-maleric anhydride, and urethance, phenolic resin, epoxy resin, novolac resin, and the mixtures thereof, and the weight-average molecular weight of the organic polymer is preferably 5,000 to 50,000.

10. A method for forming a semi-conductor element pattern, comprising the steps of:
applying the composition of claim 5 for forming an organic anti-reflective coating layer on an etching layer;
forming the organic anti-reflective coating layer by curing the composition applied on the etching layer;
forming a photoresist pattern by applying a photoresist composition on the organic anti-reflective coating layer to form a photoresist layer, exposing the photoresist layer to an exposure light of a predetermined pattern, and developing the exposed photoresist layer; and
forming an etching pattern by etching the organic anti-reflective coating layer and the etching layer.

* * * * *